United States Patent
Momma et al.

(10) Patent No.: US 11,758,651 B2
(45) Date of Patent: *Sep. 12, 2023

(54) SINTERED BODY, SUBSTRATE, CIRCUIT BOARD, AND MANUFACTURING METHOD OF SINTERED BOY

(71) Applicants: KABUSHIKI KAISHA TOSHIBA, Tokyo (JP); TOSHIBA MATERIALS CO., LTD., Yokohama (JP)

(72) Inventors: Jun Momma, Yokohama (JP); Katsuyuki Aoki, Yokohama (JP); Satoshi Takahashi, Yokohama (JP)

(73) Assignees: Kabushiki Kaisha Toshiba, Tokyo (JP); Toshiba Materials Co., Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/065,697

(22) Filed: Dec. 14, 2022

(65) Prior Publication Data

US 2023/0113938 A1 Apr. 13, 2023

Related U.S. Application Data

(63) Continuation of application No. 16/653,014, filed on Oct. 15, 2019, now Pat. No. 11,564,314, which is a (Continued)

(30) Foreign Application Priority Data

Apr. 17, 2017 (JP) ................................. 2017-081452

(51) Int. Cl.
*C04B 35/587* (2006.01)
*H05K 1/03* (2006.01)
(Continued)

(52) U.S. Cl.
CPC ......... *H05K 1/0306* (2013.01); *C04B 35/587* (2013.01); *C04B 35/597* (2013.01); *H01L 21/0217* (2013.01); *H01L 21/02227* (2013.01)

(58) Field of Classification Search
CPC .. C04B 35/587; H05K 1/0306; H01L 21/0217
See application file for complete search history.

(56) References Cited

U.S. PATENT DOCUMENTS 8,586,493 B2 11/2013 Kaga et al.
9,630,846 B2 4/2017 Nakayama et al.
(Continued)

FOREIGN PATENT DOCUMENTS

CN 1473140 A 2/2004
CN 101100388 A 1/2008
(Continued)

OTHER PUBLICATIONS

Chinese Office Action (Application No. 201880025596.7) dated Jun. 23, 2021 (with English translation).
(Continued)

*Primary Examiner* — Karl E Group
(74) *Attorney, Agent, or Firm* — BURR PATENT LAW, PLLC

(57) ABSTRACT

A sintered body includes a crystal grain containing silicon nitride, and a grain boundary phase. If dielectric losses of the sintered body are measured while applying an alternating voltage to the sintered body and continuously changing a frequency of the alternating voltage from 50 Hz to 1 MHz, an average value $\varepsilon_A$ of dielectric losses of the sintered body in a frequency band from 800 kHz to 1 MHz and an average value $\varepsilon_B$ of dielectric losses of the sintered body in a frequency band from 100 Hz to 200 Hz satisfy an expression $|\varepsilon_A - \varepsilon_B| \leq 0.1$.

10 Claims, 1 Drawing Sheet

Related U.S. Application Data continuation of application No. PCT/JP2018/015839, filed on Apr. 17, 2018.

(51) Int. Cl.
*C04B 35/597* (2006.01)
*H01L 21/02* (2006.01)

(56) References Cited

U.S. PATENT DOCUMENTS

| | | | |
|---|---|---|---|
| 11,564,314 B2 * | 1/2023 | Momma | H01L 23/373 |
| 2002/0084103 A1 | 7/2002 | Komatsu et al. | |
| 2004/0013861 A1 | 1/2004 | Miyanaga et al. | |
| 2011/0176277 A1 | 7/2011 | Kaga et al. | |
| 2011/0272187 A1 | 11/2011 | Kaga et al. | |
| 2016/0251223 A1 | 9/2016 | Nakayama et al. | |
| 2017/0152143 A1 | 6/2017 | Nakayama et al. | |
| 2018/0134558 A1 | 5/2018 | Nakayama et al. | |

FOREIGN PATENT DOCUMENTS

| | | |
|---|---|---|
| CN | 102781878 A | 11/2012 |
| CN | 103553632 A | 2/2014 |
| CN | 105000890 A | 10/2015 |
| CN | 105683129 A | 6/2016 |
| CN | 110423122 A | 11/2019 |
| CN | 110734290 A | 1/2020 |
| EP | 2 546 216 A1 | 1/2013 |
| JP | H06-100372 A1 | 4/1994 |
| JP | H10-017368 A1 | 1/1998 |
| JP | 2006-069887 A1 | 3/2006 |
| WO | 2015/060274 A1 | 4/2015 |

OTHER PUBLICATIONS

Extended European Search Report (Application No. 18787780.8) dated Dec. 7, 2020.
International Search Report and Written Opinion (Application No. PCT/JP2018/015839) dated Jul. 24, 2018.

* cited by examiner

SINTERED BODY, SUBSTRATE, CIRCUIT BOARD, AND MANUFACTURING METHOD OF SINTERED BOY

CROSS-REFERENCE TO RELATED APPLICATIONS

This application is a continuation application of U.S. patent application Ser. No. 16/653,014, filed Oct. 15, 2019, which is a continuation of prior International Application No. PCT/JP2018/015839 filed on Apr. 17, 2018, the entireties of which are incorporated herein by reference.

FIELD OF THE INVENTION

Embodiments described relate to a sintered body, a substrate, a circuit board, and a method of manufacturing the sintered body.

BACKGROUND OF THE INVENTION

A silicon nitride sintered body is known as a material having high strength. In recent years, a silicon nitride sintered body enabling both high thermal conductivity and high strength has been developed. For example, there is known a silicon nitride sintered body where the thermal conductivity, the strength, and an insulation property are improved by reducing variation in the insulation property through control of an existing ratio of a grain boundary phase in a thickness direction.

A silicon nitride substrate forms a silicon nitride circuit board by being bonded to a metal plate including a circuit. A semiconductor element in recent years has a junction temperature as high as 170° C. or more with its improved performance. The silicon nitride circuit board mounting the semiconductor element exhibits excellent durability even when the junction temperature increases.

Power elements such as a Si element, a SiC element, and a GaN element have been developed as the semiconductor element. A switching frequency becomes higher with the improved performance of the power element. The switching frequency is a cycle where turning on/off are repeated. There are various switching frequencies of a next-generation power element in a range from several 10 Hz to several 100 Hz. The switching frequency is thought to increase up to approximately 1 MHz. When turning on/off are repeated in accordance with the switching frequency, electricity flows or does not flow in accordance with the cycle.

The junction temperature and the switching frequency become higher with the improved performance of the power element. The insulation property improves even in the silicon nitride substrate. On the other hand, the insulation property in a wider frequency band has been demanded due to the enlarged switching frequency.

DETAILED DESCRIPTION

A sintered body according to an embodiment includes a crystal grain containing silicon nitride, and a grain boundary phase. If dielectric losses of the sintered body are measured while applying an alternating voltage to the sintered body and continuously changing a frequency of the alternating voltage from 50 Hz to 1 MHz, an average value $\varepsilon_A$ of dielectric losses of the sintered body in a frequency band from 800 kHz to 1 MHz and an average value $\varepsilon_B$ of dielectric losses of the sintered body in a frequency band from 100 Hz to 200 Hz satisfy an expression $|\varepsilon_A - \varepsilon_B| \leq 0.1$.

Hereinafter, embodiments are described with reference to the drawings. The drawings are schematic, and for example, sizes such as thickness and width of each component may sometimes differ from actual sizes of the component. In the embodiments, substantially the same components are denoted by the same reference signs, and a description thereof may be sometimes omitted.

Figure 1:
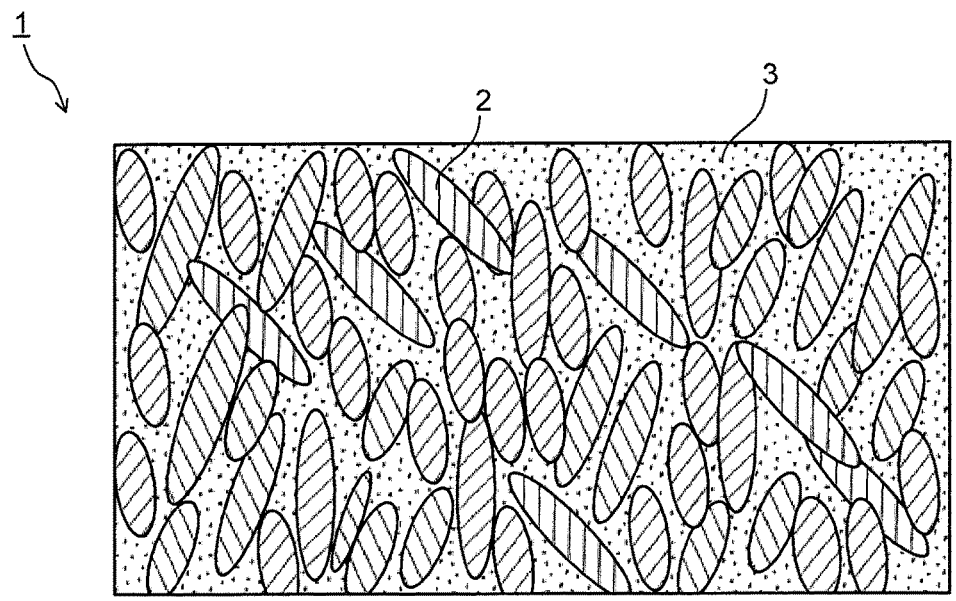
FIG. 1 is a view illustrating an example of a sectional structure of a sintered body.

FIG. 1 is a view illustrating an example of a sectional structure of a sintered body. A sectional structure of a sintered body 1 illustrated in FIG. 1 includes crystal grains 2 containing silicon nitride and a grain boundary phase 3. The sectional structure is a structure where the crystal grains 2 and the grain boundary phase 3 are mixed.

The crystal grains 2 are, for example, silicon nitride grains.

The grain boundary phase 3 has a grain boundary phase compound. Existence of the grain boundary phase compound indicates that the sintered body is formed by adding a sintering aid. This means that the sintered body 1 is a sintered body formed by adding the sintering aid and being subjected to liquid-phase sintering. The grain boundary phase 3 may have pores though these are not illustrated.

If dielectric losses of the sintered body 1 are measured while applying an alternating voltage to the sintered body 1 and continuously changing a frequency of the alternating voltage from 50 Hz to 1 MHz, an average value $\varepsilon_A$ of dielectric losses the sintered body 1 in a frequency band from 800 kHz to 1 MHz and an average value $\varepsilon_B$ of dielectric losses of the sintered body 1 in a frequency band from 100 Hz to 200 Hz satisfy an expression: $|\varepsilon_A - \varepsilon_B| \leq 0.1$.

The dielectric losses are measured by the following measuring method. A substrate (for example, a silicon nitride substrate) of the sintered body 1 with a surface roughness Ra of 1 μm or less is prepared. When the Ra exceeds 1 μm, a substrate surface is smoothed by sandblasting or the like. Next, the alternating voltage with an effective value of 1 V is applied to the substrate by using an LCR meter (manufactured by Hewlett-Packard Inc. HP16451 LCR meter or a device with the equivalent performance) at the room temperature. The dielectric losses are measured by using a ring-shaped electrode. The substrate is disposed in the ring-shaped electrode. The frequency of the alternating voltage is swept from 50 Hz to 1 MHz, then a dielectric constant and a tans value are measured to calculate the dielectric losses. The average value $\varepsilon_A$ and the average value $\varepsilon_B$ are found from the obtained dielectric losses.

The frequency is continuously changed to evaluate polarities of the crystal grain and the grain boundary phase compound. It is therefore important to measure changes in the dielectric loss and the dielectric constant while continuously changing the frequency.

A reason why the frequency is changed in the range of 50 Hz to 1 MHz is because a switching frequency (operating frequency) of a power element approximately falls within this range.

The dielectric loss is a phenomenon where when an alternating electric field is applied to a dielectric, electric energy is lost as thermal energy resulting from polarization occurred due to phase shift by the applied alternating electric field. When the polarization occurs in the sintered body, a physical property detected as a conductive component appears. There is a possibility that an insulation property is thereby lowered. Accordingly, the smaller the dielectric loss is, the less the polarization occurs and the higher the insulation property is (conductivity is difficult to be generated).

When the sintered body 1 satisfies the expression: $|\varepsilon_A-\varepsilon_B|\leq 0.1$, the change in the dielectric loss is small even when the frequency changes. The sintered body 1 preferably satisfies an expression: $0\leq|\varepsilon_A-\varepsilon_B|\leq 0.05$. Each of the average value $\varepsilon_A$ and the average value $\varepsilon_B$ is preferably 0.1 or less. The average value $\varepsilon_A$ is more preferably 0.1 or less, 0.09 or less, and further preferably 0.06 or less. The average value $\varepsilon_B$ is more preferably 0.02 or less, and further preferably 0.01 or less. When the average value $\varepsilon_A$ and the average value $\varepsilon_B$ are large values even if the value of $|\varepsilon_A-\varepsilon_B|$ is small, there is a possibility that the insulation property is lowered (largely exhibited as the conductivity). Accordingly, the average value $\varepsilon_A$ and the average value $\varepsilon_B$ are each preferably 0.1 or less.

The grain boundary phase 3 preferably has a plurality of glass compound phases provided in a region with a unit area of 100 µm×100 µm at an arbitrary cross-section of the sintered body 1 and having different compositions from one another. A glass compound is generally an insulating substance. Meanwhile, the glass compound has a different polarity depending on the composition thereof. Accordingly, there is a possibility that the insulation property is lowered when the grain boundary phase 3 has only a single glass compound phase.

The grain boundary phase compound is formed by a reaction of the sintering aid. The grain boundary phase compound is sometimes formed by a reaction between impurity elements of silicon nitride powder and the sintering aid. An example of the impurity elements of the silicon nitride powder includes oxygen or the like. The grain boundary phase compound has a glass phase, and a mixed structure between the glass phase and a crystal phase. Presence/absence of the crystal phase can be verified by presence/absence of a crystal peak obtained by X-ray diffraction (XRD) analysis.

The crystal phase has a specific crystal lattice. The crystal phase has a structure where ions and electrons are difficult to move because ions and electrons are restrained by the crystal lattice. The dielectric loss of the crystal phase is therefore difficult to change even if the frequency changes.

Meanwhile, the glass phase has a structure where a specific crystal lattice does not exist. Accordingly, the glass phase is also called an amorphous phase. The grain boundary phase compound of the sintered body is mainly formed by the reaction of the sintering aid. The sintering aid is mainly added as metal oxide. A main body of the glass phase is therefore the metal oxide (including composite oxide, oxynitride). The glass phase is an insulator at the room temperature. Carriers (cations or anions) of the insulator sometimes displace from original positions affected by an electric field. The displacement causes large dielectric loss of the insulator to lower the insulation property.

When a plurality of sintering aids are used, the grain boundary phase has a complicated structure containing a glass compound phase and a mixed phase between the glass compound phase and a crystal compound phase. Even if there is a component which is partially likely to be polarized (the glass compound phase or the crystal compound phase), the insulation property can be improved by forming the glass compound phases having different compositions. The glass compound phase and the crystal compound phase of the grain boundary phase are generically called a grain boundary compound phase.

Carrier displacement can be made to be difficult to occur by making the sintered body have a grain boundary compound phase containing two or more kinds of glass compound phases having different compositions in the region with the unit area of 100 µm×100 µm at the arbitrary cross-section. That is, a nitride sintered body with small dielectric loss from a low-frequency region to a high-frequency region can be formed. By having two or more kinds of glass compound phases in a minute region with the unit area of 100 µm×100 µm, the change in the dielectric loss can be made small. The number of kinds of the glass compound phases having different compositions is preferably two or more and 10 or less. The number of kinds is further preferably two or more and seven or less. When the number of kinds of the glass compound phases exceeds 10, there is a possibility that it becomes difficult to uniformly disperse them in the minute region. Further, uniformity of the entire sintered body is likely to be lost to cause differences in deflective strength and partial density distribution, resulting in that a constant state is difficult to be obtained by a surface grinding process or the like.

The glass compound phases having different compositions mean a plurality of glass compound phases having different constituent elements, or a plurality of glass compound phases having the same constituent element but different composition ratios. Presence/absence of the glass compound phases having different compositions can be analyzed through multivariate analysis using Raman spectroscopic analysis. Raman spectrum waveform data of each of the glass compound phases can be extracted by using the multivariate analysis. The multivariate analysis is performed by plane analysis of a unit area of 20 µm×20 µm. The Raman spectrum is analyzed in a Raman shift range of 0 $cm^{-1}$ to 1500 $cm^{-1}$. A laser with a wavelength edge of 532 nm is used as a light source.

At least one of the Raman spectra of the two or more kinds of glass compound phases having different compositions preferably has a first peak in a Raman shift range of 440 $cm^{-1}$ to 530 $cm^{-1}$ and a second peak in a Raman shift range of 990 $cm^{-1}$ to 1060 $cm^{-1}$. Having the peak at each of the Raman shift range of 440 $cm^{-1}$ to 530 $cm^{-1}$ and the Raman shift range of 990 $cm^{-1}$ to 1060 $cm^{-1}$ means that a silicon oxide ($SiO_2$)-based glass compound phase is formed.

The silicon-oxide-based glass compound phase is mainly formed by a reaction of oxygen in the silicon nitride powder or oxygen at a surface of the silicon nitride powder with the sintering aid. A residual amount of impurity oxygen in the crystal grains 2 can be reduced by forming the glass compound phase. A grain boundary phase where the polarization due to the change in the frequency is difficult to occur can be formed by forming the silicon-oxide-based glass compound phase. It is thereby possible to enable both improvement in thermal conductivity and improvement in the insulation property.

A ratio $S_{M1}/S_{M2}$ of a first largest area $S_{M1}$ with respect to a second largest area $S_{M2}$ among each of areas of the Raman spectra of the plurality of glass compound phases is preferably 1.1 or more and 3.0 or less.

The area of the Raman spectrum is defined by an area of a spectrum waveform in a Raman shift range of 0 $cm^{-1}$ to 1500 $cm^{-1}$. The spectrum waveform of the Raman spectroscopic analysis is determined in accordance with a molecular structure of the glass compound phase. When $S_{M1}/S_{M2}$ is in the range of 1.1 to 3.0, variation in a distribution state of the glass compound phases having different compositions is small. Partial variation in the insulation property is therefore difficult to occur. It is thereby possible to secure the insulation property even when the sintered body is reduced in thickness as a substrate.

Figure 2:
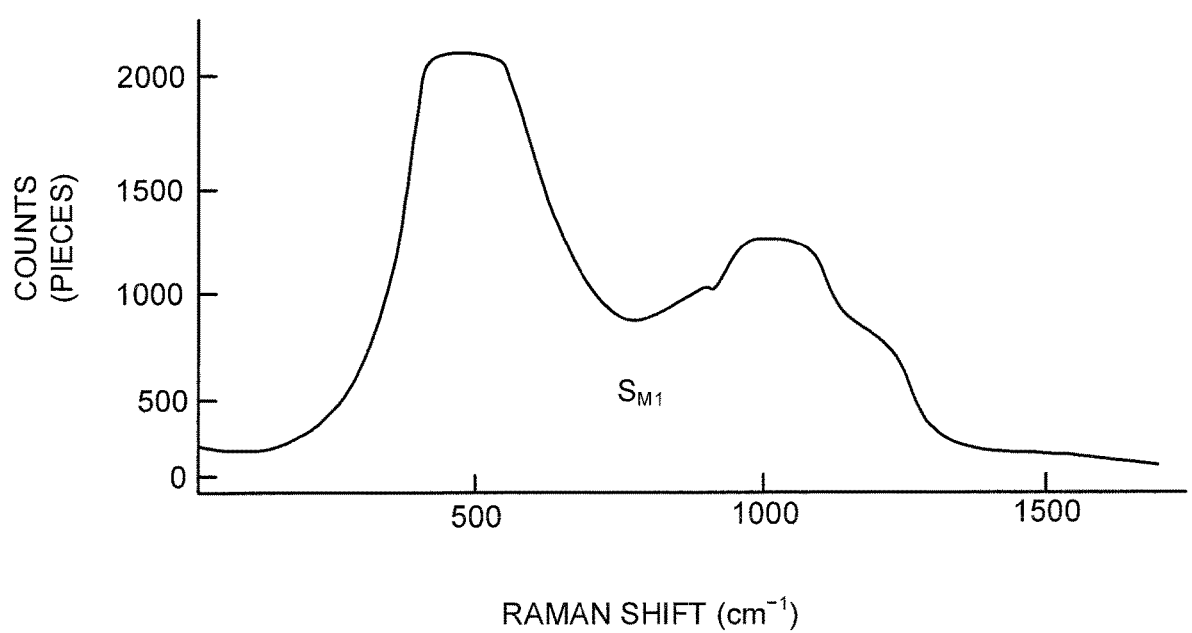
FIG. 2 is a view illustrating an example of a Raman spectrum.

FIG. 2 illustrates an example of the Raman spectrum of the glass compound phase of the sintered body. FIG. 2 exemplifies the spectrum of the glass compound phase showing the first largest area $S_{M1}$. An area where the Raman shift range is 0 cm$^{-1}$ to 1500 cm$^{-1}$ and a range where the number of counts is zero or more is found as an area of the Raman spectrum waveform.

There is a case when a grain boundary phase compound containing fluorine is included. Fluorine is an element which is likely to be contained in the silicon nitride powder to be a raw material of the sintered body. A manufacturing method of the silicon nitride powder is mainly an imide decomposition method or a direct nitridation method. The imide decomposition method uses silicon halide as a raw material. The direct nitridation method uses a fluoride compound as a catalyst to nitride metallic silicon. Accordingly, fluorine is an element which is likely to remain in the silicon nitride powder. By including the grain boundary phase compound containing fluorine, it is indicated that fluorine remained in the silicon nitride powder moves to the grain boundary phase. When fluorine remains in the crystal grains of the sintered body, there is a possibility that the crystal grains are likely to be polarized. It is therefore possible to prevent that the crystal grains are polarized by making the grain boundary phase compound contain fluorine. Presence/absence of fluorine in the grain boundary phase compound can be analyzed by a time of flight secondary ion mass spectrometry (TOF-SIMS).

A fluorine content in the sintered body is preferably 600 mass ppm or less. The fluorine content is more preferably 500 mass ppm or less. A lower limit of the fluorine amount is not particularly limited, but an amount of the grain boundary compound phase containing fluorine is preferably small. There may be the glass compound phase and the crystal phase in the grain boundary compound phase containing fluorine.

The sintered body preferably has thermal conductivity of 50 W/m·K or more. The thermal conductivity is more preferably 80 W/m·K or more. The thermal conductivity is measured by a laser flash method.

The sintered body preferably has three-point bending strength of 600 MPa or more. The three-point bending strength is more preferably 650 MPa or more. The three-point bending strength is measured based on JIS R1601 (2008).

Fracture toughness is preferably 5.5 MPa·m$^{1/2}$ or more. The fracture toughness is more preferably 6.5 MPa·m$^{1/2}$ or more. The fracture toughness is measured based on an IF method of JIS R1607, and found by using Niihara's method. As mentioned above, the sintered body according to the embodiment is able to obtain the thermal conductivity, the three-point bending strength, and the fracture toughness in addition to suppressing the change in the dielectric loss with respect to the frequency.

Such a sintered body is suitable for a silicon nitride substrate. A thickness of the substrate is preferably 0.4 mm or less, and more preferably 0.3 mm or less. The sintered body according to the embodiment is able to keep an excellent insulation property even when the thickness of the substrate is reduced. The sintered body is therefore able to exhibit the excellent insulation property even when a switching frequency of a semiconductor element is applied to a wide range. Thermal resistance as a component can also be lowered because the substrate can be made thin. The substrate may have a three dimensional structure without being limited to a single plate. The substrate is also suitable for a circuit board where a metal plate is bonded to a surface thereof. Examples of the metal plate include a Cu plate, an Al plate, or an alloy of these. Examples of a bonding method between the metal plate and the substrate include various methods such as an active metal bonding method. There are methods using an Ag-Cu-Ti-based brazing material, an Al-Si-based brazing material in the active metal bonding method. The circuit board may be provided with a metallization layer or a metal thin film layer instead of the metal plate. The substrate may be used for a double-sided cooling structure module using a pressure contact structure.

Next, a manufacturing method of the sintered body is described. The manufacturing method of the sintered body according to the embodiment is not particularly limited as long as the sintered body has the aforementioned constitution, but the following manufacturing method can be cited as the method to efficiently obtain the sintered body.

The manufacturing method of the sintered body includes: a step of preparing a mixed solution by mixing silicon nitride powder, a surface modification agent, a polymer binder, and an organic compound having the same functional group as a functional group of the polymer binder and a mean molecular weight smaller than that of the polymer binder in a solvent; a step of preparing a raw material solution by adding sintering aid powder to the mixed solution; a step of preparing a raw material slurry by subjecting the raw material solution to a defoaming process; a step of forming a sheet by molding the raw material slurry; a step of preparing a degreased body by heating the sheet at a temperature of 1000° C. or less; and a step of sintering the degreased body at a temperature of 1600° C. or more and 2000° C. or less.

The silicon nitride powder preferably has an alpha-conversion rate of 80 mass % or more, an average particle diameter of 0.4 μm or more and 2.5 μm or less, and an impurity oxygen content of 2 mass % or less. The impurity oxygen content is preferably 2 mass % or less, more preferably 1.0 mass % or less, and further preferably 0.1 mass % or more and 0.8 mass % or less. When the impurity oxygen content exceeds 2 mass %, there is a possibility that the thermal conductivity is lowered.

A fluorine amount contained in the silicon nitride powder is 700 mass ppm or less in terms of a simple-substance fluorine. When the fluorine amount exceeds 700 mass ppm, it becomes difficult to control the fluorine amount in the sintered body to 600 mass ppm or less.

The surface modification agent is a component to improve a physical property of a silicon nitride powder surface. Examples of the surface modification include modification by coating, modification by a coupling reaction, and so on. A coupling agent is preferable as the surface modification agent. Examples of the coupling agent include a silane coupling agent, a titanate coupling agent, and so on. Among them, the silane coupling agent is preferable. The silane coupling agent is a compound expressed by a general formula: $(RO)_3$—SiR'. The RO group is a functional group generating a silanol group (Si—OH) by hydrolysis. The R' group is a non-hydrolyzable group, and a functional group having affinity and reactivity with a resin. Since the silane coupling agent contains Si (silicon) as a constituent element, two or more kinds of glass compound phases having different compositions are likely to be formed.

Sintering of the silicon nitride proceeds through a liquid phase formed by dissolving a plurality of sintering aids. A "glass phase" generated from oxide added as the sintering aid and oxide or oxynitride of silicon contained in the silicon nitride as an impurity is contained in this liquid phase. A plurality of cations are dissolved into the liquid phase from various sintering aids, and when the glass phase is generated from this liquid phase, a vitrification temperature changes depending on a concentration and a composition of the dissolved cations. Such a temperature change generates a phase separation of glass. An example of the phase separation reaction includes, for example, spinodal decomposition, and the two or more kinds of glass phases having different compositions are generated in the grain boundary phase of the sintered body in the silicon nitride where the plurality of sintering aids are added as the reaction proceeds.

The polymer binder is a resin binder (what is called a binding agent). The polymer binder is preferably an acrylic resin. An example of an organic compound having the same functional group as the polymer binder and a mean molecular weight smaller than the polymer binder includes a surface-active agent such as a surface-active agent having a carboxyl group.

The surface-active agent is an organic compound including both a part having hydrophilicity and a part having lipophilicity in a molecule. Examples of the surface-active agent include various materials such as an anion-based surface-active agent, a cation-based surface-active agent, and a nonion (non-ion)-based surface-active agent. Free energy of a surface (surface tension) can be lowered by using the surface-active agent. It is thereby possible to uniformly mix various raw materials such as the sintering aid powder being oxide, the silicon nitride powder where moisture and ammonia are adsorbed to the surface. It is possible to form the two or more kinds of glass compound phases having different compositions in a minute region with the unit area of 100 μm×100 μm by uniformly mixing various raw materials.

The silicon nitride powder is powder which is likely to adsorb moisture (or ammonia). The moisture contained in the atmosphere is adsorbed, then a hydroxyl group (OH group) is adsorbed to the silicon nitride powder surface. When adsorption of moisture occurs, change in a surface physical property occurs between an adsorbing part and a non-adsorbing part. An oxide film is able to be formed at a surface of a crystal of silicon nitride after sintering by making the surface modification agent react with the hydroxyl group at the raw material powder surface before making the surface modification agent react with the polymer binder. When the organic compound having the same functional group with the polymer binder (binding agent) and the mean molecular weight smaller than the polymer binder is added, the surface modification agent and the polymer binder are made to react at a degreasing reaction time to prevent that the degreasing is difficult to occur due to the enlarged molecular weight of the binder.

When the polymer binder is the acrylic resin, the same functional group is preferably a carboxyl group. The carboxyl group is represented by "—COOH". Materials having the carboxyl group exist in both the acrylic-based polymer binder and the nonion-based surface-active agent, and a combination satisfying conditions is likely to be prepared. The mean molecular weight of the surface-active agent is preferably smaller than the mean molecular weight of the polymer binder. A material having the same functional group as the polymer binder and the mean molecular weight smaller than the polymer binder is preferable as the surface-active agent. The reaction between the surface modification agent and the surface-active agent is thereby likely to be accelerated.

A plasticizer is preferably mixed in the solvent mixing the silicon nitride powder, the surface-active agent, the surface modification agent, and the polymer binder. Phthalate esters, adipate esters, other surface active substances, polymeric plasticizer, and so on can be used as the plasticizer. Various solvents such as alcohols, ketones, toluenes, ethers, and esters can be used as the solvent. One kind or a mixed solvent of two kinds from among alcohols and ketones or toluenes is preferable as the solvent. The mixed solvent is able to improve solubility of the polymer binder.

The sintering aid powder is preferably a metal oxide powder with an average particle diameter of 0.5 μm or more and 3.0 μm or less. Examples of the metal oxide powder include oxides of a rare earth element, magnesium, titanium, hafnium, and so on. A liquid phase component is likely to be formed during a sintering step by adding the sintering aid as the metal oxide. One kind or two kinds or more selected from the rare earth element, magnesium, titanium, hafnium are added as the sintering aid as a total of 1 mass % or more and 14 mass % or less in terms of oxide. In particular, two kinds or more are preferably added. The two kinds or more of glass compound phases having different components are likely to be formed by adding two or more kinds of sintering aids.

Next, the raw material solution is subjected to the defoaming process to form a raw material slurry. The defoaming process is a process to remove bubbles in the raw material solution by stirring the raw material solution in a vacuum. It is possible to reduce bubbles in the sintered body by reducing the bubbles in the raw material solution. By performing the defoaming process, the raw material solution can be made into slurry with high viscosity.

Next, a sheet is formed by molding the raw material slurry. The sheet molding is preferably performed by a doctor blade method. Mass productivity can be improved through the doctor blade method. Examples of the sheet molding method other than the doctor blade method include a metal mold pressing method, a cold isostatic pressing (CIP) method, a roll molding method, and so on. A thickness of the substrate becomes likely to be adjusted by performing the sheet molding. The sheet is cut before it is subjected to a degreasing step to process into a target size.

Next, the step of heating the sheet at the temperature of 1000° C. or less to prepare a degreased body is performed. An inert atmosphere such as nitrogen gas, argon gas is preferable as an atmosphere of the degreasing step. The atmosphere may be an oxygen-containing atmosphere where oxygen is contained in the inert atmosphere.

A degreasing temperature is preferably 1000° C. or less, and more preferably in a range of 500° C. or more and 800° C. or less. Since a thermal decomposition temperature of the polymer binder can be controlled by performing the degreasing step in the above temperature range, it is possible to prevent that a compact is broken due to emission of thermal decomposition gas in accordance with degreasing.

When the degreasing temperature exceeds 1000° C., the polymer binder is rapidly burned and the compact is likely to be broken. Meanwhile, when the degreasing temperature is less than 500° C., there is a possibility that the sintered body cannot be densified because the thermal decomposition of the polymer binder becomes insufficient. It is therefore preferable that organic substances such as the polymer binder is thermally decomposed at the temperature of 1000° C. or less, further in the range of 500° C. or more and 800°

C. or less. It is possible to make the thermal decomposition of the organic substances such as the polymer binder to be oxidative decomposition by performing the degreasing step in the oxygen-containing atmosphere. The oxidative decomposition means a combustion reaction.

The surface modification agent has high reactivity and is likely to react with the functional group of the polymer binder during the degreasing step. When the surface modification agent reacts with the polymer binder, the polymer binders are crosslinked with each other to have a large molecular structure, resulting in that the thermal decomposition is difficult to proceed. As a result, deformation of the compact is likely to occur because the thermal decomposition rapidly occurs at the high temperature, and the the thermal decomposition gas is also rapidly emitted. The surface modification agent and the surface-active agent are previously reacted with each other to prevent the crosslinkage of the polymer binders by adding the surface-active agent having the same functional group as the functional group of the polymer binder. It is thereby possible to suppress increase in the thermal decomposition temperature of the polymer binder and to suppress the deformation of the compact. As mentioned above, the carboxyl group is the functional group existing in both the polymer binder and the surface-active agent. In other words, it is preferable to use the polymer binder and the surface-active agent each having the carboxyl group.

Next, the degreased body is sintered at the temperature of 1600° C. or more and 2000° C. or less. A pressure in a firing furnace is preferably a pressurized atmosphere. When the sintering temperature is less than 1600° C., densification of the sintered body becomes insufficient. When the sintering temperature exceeds 2000° C., there is a possibility that the degreased body is decomposed into Si and $N_2$ when a furnace atmosphere pressure is low. The sintering temperature is preferably in a range of 1700° C. or more and 1900° C. or less. Within this range, the plurality of glass component phases having different compositions are generated by the sintering aid and impurity oxygen, and the liquid phase sintering of silicon nitride is likely to proceed. Since impurity fluorine contained in silicon nitride is also decomposed, it becomes easy to decrease the fluorine content and to seal fluorine in the grain boundary compound phase.

The sintered body after the sintering step is preferably cooled at a cooling rate of 100° C./h (hour) or less. The grain boundary phase can be crystallized and a ratio of the crystal compound in the grain boundary phase can be made large by slowly cooling the sintered body at the cooling rate of 100° C./h or less, further 50° C./h or less. When an addition amount of the sintering aid is 6 mass % or more as a total, an effect to improve thermal conductivity is large by crystallizing the grain boundary phase. In other words, when the addition amount of the sintering aid is less than 6 mass %, the thermal conductivity can be improved without crystallizing the grain boundary phase.

The sintered body can be manufactured through the aforementioned steps. When a substrate including the sintered body is formed, a substrate with a sheet thickness of 0.4 mm or less, further 0.3 mm or less is likely to be fabricated by fabricating a compact in a thin-sheet shape by subjecting a surface of the sintered body to surface treatment such as a honing process and polishing according to need. When the sintered body is used as a circuit board, a step of bonding a metal plate or the like is performed.

EXAMPLES

Examples 1 to 6, Comparative Example 1

Mixed solutions (Samples 1 to 4) were prepared by preparing each combination of silicon nitride powder, a surface modification agent, a polymer binder, a surface-active agent, a plasticizer, and a solvent listed in Table 1, and mixing in the solvent.

A material having the same functional group as a functional group of the polymer binder and a mean molecular weight smaller than the polymer binder was used as the surface-active agent. A polymeric plasticizer is used as the plasticizer. In each of Sample 1 and Sample 2, the solvent was mixed such that n-butanol, methylethylketone, and toluene have a molar ratio of 6:54:40. Sample 3 did not use the surface modification agent. Sample 4 did not use the surface-active agent.

TABLE 1

| Mixed solution | Silicon nitride powder | | | | Surface modification agent | Polymer binder | Surface-active agent | Solvent |
|---|---|---|---|---|---|---|---|---|
| | Average particle diameter (μm) | Alpha-conversion rate (%) | Oxygen concentration (mass %) | Fluorine concentration (mass ppm) | | | | |
| Sample 1 | 0.8 | 95 | 1.2 | 200 | Silane coupling agent | Acrylic resin having carboxyl group | Surface-active agent having carboxyl group | n-butanol methylethyl ketone toluene |
| Sample 2 | 1.0 | 96 | 1.0 | 600 | Silane coupling agent | Acrylic resin having carboxyl group | Surface-active agent having carboxyl group | n-butanol methylethyl ketone toluene |
| Sample 3 | 0.8 | 95 | 1.2 | 200 | — | Acrylic resin having carboxyl group | Surface-active agent having carboxyl group | n-butanol methylethyl ketone toluene |
| Sample 4 | 0.8 | 95 | 1.2 | 200 | Silane coupling agent | Acrylic resin having carboxyl group | — | n-butanol methylethyl ketone toluene |

Next, a sintering aid was added to each of the mixed solution samples 1 to 4 to prepare raw material solutions of the silicon nitride sintered bodies to be Examples 1 to 6, Comparative examples 1 to 2. Each addition amount of the sintering aid was listed such that a total amount with the silicon nitride powder became 100 mass %. Ratios thereof are listed in Table 2.

TABLE 2

|  | Mixed solution | Sintering aid | | | | |
|---|---|---|---|---|---|---|
|  |  | $Y_2O_3$ (mass %) | $Er_2O_3$ (mass %) | $HfO_2$ (mass %) | $TiO_2$ (mass %) | MgO (mass %) |
| Example 1 | Sample 1 | 4 | 4 | 1 | 1 | 1 |
| Example 2 | Sample 1 | 6 | — | 2 | 1 | 1 |
| Example 3 | Sample 1 | 3 | — | — | — | 2 |
| Example 4 | Sample 2 | 3 | 5 | 1 | 1 | 1 |
| Example 5 | Sample 2 | 7 | — | 1 | 1 | 1 |
| Example 6 | Sample 2 | 3 | — | 1 | — | 1 |
| Comparative example 1 | Sample 3 | 4 | 4 | 1 | 1 | 1 |
| Comparative example 2 | Sample 4 | 4 | 4 | 1 | 1 | 1 |

Each of the raw material solutions of Examples and Comparative examples was subjected to a defoaming process to make it into slurry. The deforming process was performed by subjecting each raw material solution to a vacuum defoaming process while stirring. Each sheet was prepared by molding the obtained slurry by the doctor blade method. Each sheet was processed into a predetermined size to be subjected to a degreasing step and a sintering step. The degreasing step was performed at the temperature of 600° C. or more and 800° C. or less, and in a nitrogen atmosphere. Results thereof are listed in Table 3.

TABLE 3

|  | Sintering | Cooling rate after sintering | Substrate size | | |
|---|---|---|---|---|---|
|  |  |  | Vertical size (mm) | Horizontal size (mm) | Thickness (mm) |
| Example 1 | 1780° C. × 8 h | 50° C./h | 50 | 30 | 0.32 |
| Example 2 | 1850° C. × 10 h | 40° C./h | 40 | 30 | 0.2 |
| Example 3 | 1860° C. × 10 h | 400° C./h | 50 | 30 | 0.25 |
| Example 4 | 1870° C. × 6 h | 50° C./h | 40 | 30 | 0.25 |
| Example 5 | 1830° C. × 10 h | 40° C./h | 50 | 40 | 0.2 |
| Example 6 | 1870° C. × 9 h | 600° C./h | 40 | 30 | 0.25 |
| Comparative example 1 | 1780° C. × 8 h | 50° C./h | 50 | 30 | 0.32 |
| Comparative example 2 | 1780° C. × 8 h | 50° C./h | 50 | 30 | 0.32 |

Thermal conductivity, three-point strength, and porosity were measured for each of silicon nitride substrates formed by the silicon nitride sintered bodies of Examples and Comparative examples. The thermal conductivity was measured by the laser flash method. The three-point strength was measured based on JIS-R-1601 (2008). The porosity was measured by a mercury intrusion method. A fluorine content in each silicon nitride sintered body was examined. The sintered body was pulverized to be a powder state with a center particle diameter of 150 μm or less, and the fluorine amount generated after the thermal hydrolysis was quantitatively analyzed by ion chromatography based on JIS-R-1603. Results thereof are listed in Table 4.

TABLE 4

|  | Thermal conductivity (W/m · K) | Three-point bending strength (MPa) | Porosity (%) | Fluorine content (mass ppm) |
|---|---|---|---|---|
| Example 1 | 95 | 700 | 0.2 | 50 |
| Example 2 | 90 | 660 | 0.2 | 110 |
| Example 3 | 85 | 780 | 0.3 | 130 |
| Example 4 | 93 | 650 | 0.5 | 450 |
| Example 5 | 87 | 600 | 0.4 | 500 |
| Example 6 | 80 | 730 | 0.5 | 520 |
| Comparative example 1 | 89 | 680 | 0.5 | 130 |
| Comparative example 2 | 85 | 650 | 0.5 | 150 |

As it is clear from Table, the silicon nitride substrates of Examples and Comparative examples exhibited excellent properties in both the thermal conductivity and the three-point bending strength. Next, presence/absence of the two kinds or more of glass compound phases having different compositions, presence/absence of the glass compound phase containing fluorine were examined.

The presence/absence of the plurality of glass compound phases having different compositions was evaluated by setting a measurement visual field to be a unit area of 100 μm×100 μm and performing the Raman spectroscopic analysis at an arbitrary cross-section of each silicon nitride substrate. The Raman spectroscopic analysis was performed by multivariate analysis (plane analysis). The Raman spectrum was measured in a Raman shift range of 0 cm$^{-1}$ or more and 1500 cm$^{-1}$ or less. The presence/absence of the plurality of glass compound phases having different compositions was measured by individual Raman spectrum. In a spectrum waveform of the glass compound phase, presence/absence of a peak was also examined in each of a Raman shift range of 440 cm$^{-1}$ or more and 530 cm$^{-1}$ or less and in a Raman shift range of 990 cm$^{-1}$ or more and 1060 cm$^{-1}$ or less. An $S_{M1}/S_{M2}$ was also found. The presence/absence of the grain boundary phase compound containing fluorine was found by the TOF-SIMS. Results thereof are listed in Table 5.

TABLE 5

|  | Raman spectroscopic analysis (multivariate analysis) | | | | TOS-SIMS Presence/absence of grain boundary phase compound containing fluorine |
|---|---|---|---|---|---|
|  | Presence/absence of plurality of glass compound phases | Presence/absence of peak | | $S_{M1}/S_{M2}$ |  |
|  |  | 440-530 cm$^{-1}$ | 990-1060 cm$^{-1}$ |  |  |
| Example 1 | Present | Present | Present | 1.2 | Present |
| Example 2 | Present | Present | Present | 1.5 | Present |
| Example 3 | Present | Present | Present | 2.8 | Present |

TABLE 5-continued

| | Raman spectroscopic analysis (multivariate analysis) | | | | TOS-SIMS Presence/absence of grain boundary phase compound containing fluorine |
|---|---|---|---|---|---|
| | Presence/absence of plurality of glass compound phases | Presence/absence of peak 440-530 cm⁻¹ | 990-1060 cm⁻¹ | $S_{M1}/S_{M2}$ | |
| Example 4 | Present | Present | Present | 1.8 | Present |
| Example 5 | Present | Present | Present | 2.5 | Present |
| Example 6 | Present | Present | Present | 2.3 | Present |
| Comparative example 1 | Absent | Present | Present | — | Absent |
| Comparative example 2 | Absent | Present | Present | — | Present |

As it is clear from Table, the two or more kinds of glass compound phases having different compositions were verified in the silicon nitride substrates of Examples. In each of Examples, the peak was verified in each of the Raman shift range of 440 cm⁻¹ or more and 530 cm⁻¹ or less and the Raman shift range of 990 cm⁻¹ or more and 1060 cm⁻¹ or less. The $S_{M1}/S_{M2}$ was 1.1 or more and 3.0 or less. The grain boundary phase compound containing fluorine was also verified. FIG. 1 is a view illustrating the largest Raman spectrum $S_{M1}$ in the glass compound phase of Example 1.

On the other hand, the two or more kinds of glass compound phases having different compositions were not verified in Comparative example 1 and Comparative example 2.

Next, an insulation property of each of the silicon nitride substrates of Examples and Comparative examples was examined. As the insulation property, a dielectric breakdown voltage was examined. Frequency dependence of dielectric loss was examined.

The dielectric breakdown voltage (dielectric strength) was measured by a two-terminal method based on JIS-C-2141. A column-shaped electrode with a diameter at a tip of 20 mm was used as a measuring terminal. The measurement of the dielectric strength was performed in Fluorinert. A frequency of an alternating voltage was set as 50 Hz.

The frequency dependence of the dielectric loss was measured by applying the alternating voltage with the effective value of 1 V by using an LCR meter (manufactured by Hewlett-Packard Inc. HP16451) at the room temperature. The dielectric losses were measured while applying the alternating voltage (1 V) and continuously changing the frequency of the alternating voltage from 50 Hz to 1 MHz to find a value of $|\varepsilon_A-\varepsilon_B|$. The dielectric losses were measured by using a ring-shaped electrode. The frequency was swept from 50 Hz to 1 MHz, a dielectric constant and a tans value were measured to calculate the dielectric losses. Results thereof are listed in Table 6.

TABLE 6

| | Dielectric strength (kV/mm) | $\varepsilon_A$ | $\varepsilon_B$ | $|\varepsilon_A - \varepsilon_B|$ |
|---|---|---|---|---|
| Example 1 | 18 | 0.042 | 0.001 | 0.041 |
| Example 2 | 20 | 0.051 | 0.001 | 0.050 |
| Example 3 | 17 | 0.092 | 0.008 | 0.084 |
| Example 4 | 25 | 0.055 | 0.001 | 0.054 |
| Example 5 | 16 | 0.068 | 0.007 | 0.061 |
| Example 6 | 21 | 0.071 | 0.002 | 0.069 |
| Comparative example 1 | 17 | 0.271 | 0.022 | 0.249 |
| Comparative example 2 | 15 | 0.381 | 0.061 | 0.320 |

As it is clear from Table, there was not a large difference in the dielectric strength among the silicon nitride substrates of Examples and Comparative examples. Meanwhile, there was a difference in the frequency dependence. Accordingly, $|\varepsilon_A-\varepsilon_B|$ when a switching frequency of a semiconductor element becomes large was smaller in each of the silicon nitride substrates of Examples. This is because both dielectric loss value at a high-frequency region (average value $\varepsilon_A$) and dielectric loss at a low-frequency region (average value $\varepsilon_B$) are low. Meanwhile, $|\varepsilon_A-\varepsilon_B|$ of each of Comparative examples was particularly high value. Accordingly, it is clear that the insulation property can be secured in each of the silicon nitride substrates of Examples even when an operating frequency range of the semiconductor element becomes wide. It is therefore possible to use the silicon nitride substrate for various circuit boards.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. The above-stated respective embodiments can be embodied by combining with each other.

What is claimed is:
1. A substrate comprising a sintered body,
the sintered body having:
a crystal grain containing silicon nitride; and
a grain boundary phase,
wherein,
a thickness of the substrate is 0.4 mm or less,
a three-point bending strength of the substrate is 600 MPa or more,
the grain boundary phase includes glass compound phases provided in a region with a unit area of 100 μm×100 μm at a cross-section of the sintered body and having different compositions, at least one of Raman spectra of the glass compound phases has:
a first peak in a Raman shift range from 440 cm-1 to 530 cm-1; and
a second peak in a Raman shift range from 990 cm-1 to 1060 cm-1,
when dielectric losses of the sintered body are measured while applying an alternating voltage to the sintered body and continuously changing a frequency of the alternating voltage from 50 Hz to 1 MHz, an average value εA of dielectric losses of the sintered body in a frequency band from 800 kHz to 1 MHz and an average value εB of dielectric losses of the sintered body in a frequency band from 100 Hz to 200 Hz satisfy an expression $|εA−εB|≤0.1$.

2. The substrate according to claim 1, wherein
each of the average value εA and the average value εB is 0.1 or less.

3. The substrate according to claim 1, wherein
a ratio of a first largest area SM1 to a second largest area SM2 of areas of the Raman spectra of the glass compound phases is 1.1 or more and 3.0 or less.

4. The substrate according to claim 1, wherein
the grain boundary phase contains fluorine.

5. The substrate according to claim 1, wherein
a ratio of a first largest area SM1 to a second largest area SM2 of areas of the Raman spectra of the glass compound phases is 1.1 or more and 3.0 or less, and
the grain boundary phase contains fluorine.

6. The substrate according to claim 1, wherein
thermal conductivity of the sintered body is 50 W/m·K or more.

7. A circuit board comprising:
the substrate according to claim 1; and
a metal plate bonded to the substrate.

8. A method of manufacturing a substrate according to claim 1, comprising:
mixing silicon nitride powder, a surface modification agent, a polymer binder, and an organic compound in a solvent to form a mixed solution, the polymer binder having a first functional group and a first mean molecular weight, the organic compound having a second functional group as same as the first functional group and a second mean molecular weight smaller than the first mean molecular weight;
adding sintering aid powder into the mixed solution to form a raw material solution;
defoaming the raw material solution to form a raw material slurry;
molding the raw material slurry to form a sheet;
heating the sheet at a temperature of 1000° C. or less to form a degreased body; and
sintering the degreased body at a temperature of 1600° C. or more and 2000° C. or less, wherein,
the polymer binder is an acrylic resin, and
the organic compound has a carboxyl group.

9. The method according to claim 8, wherein
the organic compound is configured to react with the surface modification agent at a temperature less than or equal to a thermal decomposition temperature of the polymer binder.

10. The method according to claim 8, wherein
the surface modification agent is a silane coupling agent.

* * * * *